United States Patent
Krivokapic

(10) Patent No.: US 6,623,803 B1
(45) Date of Patent: Sep. 23, 2003

(54) COPPER INTERCONNECT STAMPING

(75) Inventor: Zoran Krivokapic, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 176 days.

(21) Appl. No.: 09/712,642

(22) Filed: Nov. 14, 2000

(51) Int. Cl.⁷ .............. B05D 3/10; B05D 5/12; B05D 1/32; B05D 1/36; C23F 1/00

(52) U.S. Cl. .............. 427/304; 427/98; 427/443.1; 427/305; 427/264; 427/271; 427/437; 427/404; 438/678; 438/687; 438/689; 216/13; 216/41

(58) Field of Search .............. 427/98, 443.1, 427/304, 305, 264, 271, 437, 404; 438/678, 687, 689; 216/13, 41

(56) References Cited

U.S. PATENT DOCUMENTS

| | | | |
|---|---|---|---|
| 4,898,648 A | * | 2/1990 | Cusano .............. 205/159 |
| 5,443,865 A | * | 8/1995 | Tisdale et al. .............. 427/304 |
| 5,512,131 A | | 4/1996 | Kumar et al. .............. 156/655.1 |
| 5,900,160 A | | 5/1999 | Whitesides et al. .............. 216/41 |
| 6,060,121 A | | 5/2000 | Hidber et al. .............. 427/261 |

FOREIGN PATENT DOCUMENTS

| | | | |
|---|---|---|---|
| WO | WO 96/29629 | * | 9/1996 |
| WO | WO 97/34025 | * | 9/1997 |

OTHER PUBLICATIONS

Younan Xia and George M. Whitesides, Soft Lithography, Annual Review of Materials Science, vol. 28, 1998, pp. 153–185.

What is electroless plating?, printed from Internet address: wysiwyg://171/http://antoine.fsu.umd....1/redox/faq/electroless-plating.shtml on Oct. 13, 2000, 3 pages.

* cited by examiner

Primary Examiner—Michael Barr
(74) Attorney, Agent, or Firm—Foley & Lardner

(57) ABSTRACT

A method of patterning a layer of copper on a material surface includes providing a stamp having a base and a stamping surface and providing a copper plating catalyst on the stamping surface. The method can also include applying the stamping surface to the material surface, wherein a pattern of copper plating catalyst is applied to the material surface. The method can further include providing a copper solution over the copper plating catalyst, whereby a layer of copper is patterned on the material surface.

20 Claims, 3 Drawing Sheets

COPPER INTERCONNECT STAMPING

CROSS-REFERENCE TO RELATED APPLICATIONS

Not Applicable.

STATEMENT REGARDING FEDERALLY SPONSORED RESEARCH OR DEVELOPMENT

Not Applicable.

FIELD OF THE INVENTION

The present specification relates generally to fabrication processes for integrated circuits (ICs). More specifically, the present specification relates to a system for and method of patterning a layer of copper on a layer of material.

BACKGROUND OF THE INVENTION

The semiconductor industry desires to manufacture integrated circuits (ICs) with higher and higher densities of devices on a smaller chip area to achieve greater functionality and to reduce manufacturing costs. This desire for large-scale integration has led to a continued shrinking of the circuit dimensions and features of the devices.

The ability to reduce the size of structures such as shorter gate lengths in field-effect transistors is driven by lithographic technology which is, in turn, dependent upon the wavelength of light used to expose the photoresist. In current commercial fabrication processes, optical devices expose the photoresist using light having a wavelength of 248 nm (nanometers). Research and development laboratories are experimenting with the 193 nm wavelength to reduce the size of structures. Further, advanced lithographic technologies are being developed that utilize radiation having a wavelength of 157 nm and even shorter wavelengths, such as those used in Extreme Ultra-Violet (EUV) lithography (e.g., 13 nm).

One challenge facing lithographic technology is fabricating features below 100 nm. Although photolithography is the most widely used technology in IC fabrication, other fabrication technologies are being explored. One such technology is "soft lithography", which is a non-photolithographic strategy based on such techniques as self-assembly, replica molding, and stamping. Examples are provided in U.S. Pat. No. 5,512,131 (Kumar et al.), U.S. Pat No. 5,900,160 (Whitesides et al.), and U.S. Pat. No. 6,060,121 (Hidber et al.), and also in Xia, Y. and Whitesides, G., "Soft Lithography", Annu. Rev. Mater. Sci. 1998, 28:153–84.

As explained by Xia and Whitesides, soft lithography utilizes an elastomeric block or stamp with patterned relief structures on its surface. The elastomeric block is cast molded, coated with a self-assembled monolayer (SAM), then printed onto a suitable medium, such as Au or Ag. A thin monolayer of material having a desired chemical property results. Soft lithography has been proposed for such applications as microcontact printing of SAMs, patterned SAMs as resists in selective wet etching, patterned SAMs as templates in selective deposition, micromolding, and related techniques.

One area of lithography which requires further development is the area of interconnects. As device sizes continue to decrease, the reduction in interconnect size has remained an obstacle.

Accordingly, what is needed is an improved system for and method of patterning a layer of copper on a material surface. Further, what is needed is a system for and method of patterning copper interconnects on an integrated circuit. Further still, what is needed is an interconnect fabrication process for providing interconnects having a smaller thickness. Further yet, what is needed is an elastomer stamper suitable for use in an interconnect stamping process.

The teachings hereinbelow extend to those embodiments which fall within the scope of the appended claims, regardless of whether they accomplish one or more of the above-mentioned needs.

SUMMARY OF THE INVENTION

According to an exemplary embodiment, a method of patterning a layer of copper on a material surface is provided. The method includes providing a stamp having a base and a stamping surface. The stamping surface defines a pattern. The method also includes providing a copper plating catalyst on the stamping surface; applying the stamping surface to the material surface. A pattern of copper plating catalyst is applied to the material surface. The method further includes providing a copper solution over the copper plating catalyst. A layer of copper is patterned on the material surface according to the method.

According to another exemplary embodiment, a method of fabricating copper interconnects on an integrated circuit is provided. The method includes stamping a predetermined pattern of copper plating catalyst on a layer of the integrated circuit and providing a copper solution over the copper plating catalyst. Copper interconnects are fabricated on the layer according to the method.

According to yet another exemplary embodiment, a method of making a stamp for an integrated circuit fabrication process is provided. The method includes providing a substrate, applying first and second layers of material on the substrate, forming a first aperture in the first layer of material, forming a second aperture in the second layer of material through the first aperture, and etching the substrate through the first and second apertures to form grooves in the substrates. The method also includes filling the grooves with an elastomer and allowing the elastomer to harden.

BRIEF DESCRIPTION OF THE DRAWINGS

The invention will become more fully understood from the following detailed description, taken in conjunction with the accompanying drawings, wherein like reference numerals refer to like parts, in which.

DETAILED DESCRIPTION OF EXEMPLARY EMBODIMENTS

Figure 1:
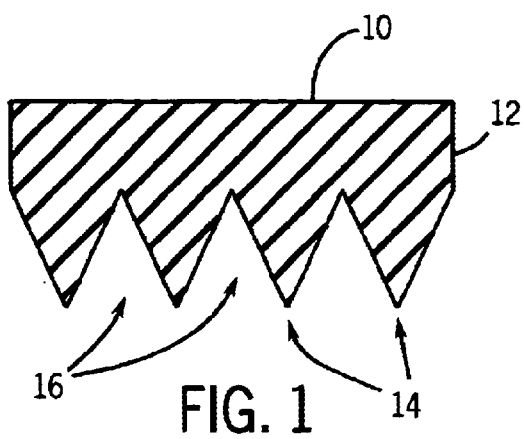
FIG. 1 is a schematic cross-sectional view of a stamp, according to an exemplary embodiment.

Referring first to FIG. 1, a stamp 10 is illustrated. Stamp 10 comprises an elastomer in this exemplary embodiment, such as, poly(dimethylsiloxane) (PDMS), a silicon rubber, a polyurethane, a polyimide, or other elastomers. Stamp 10 includes a base portion 12 and a stamping surface 14. Stamping surface 14 is configured in this exemplary embodiment with an interconnect pattern comprising a plurality of sharp edges. Accordingly, stamp 10 is suitable for printing a plurality of parallel lines via stamping surfaces 14 onto a substrate or layer of material. Stamping surface 14 will transfer the interconnect pattern during a microcontact soft lithography printing process, as will be described hereinbelow. Due to the sharp edge feature of stamping surface 14, very small lines can be printed or stamped.

Stamp 10 include a plurality of grooves 16 which at least partially define stamping surface 14. Each of grooves 16 is between 50 and 100 nanometers (nm) deep, but may have a greater or lesser depth depending upon the desired pitch. The distance between each of stamping surfaces 14 at its tip is between 100 and 200 nm in this exemplary embodiment, but may be less. This distance corresponds to a metal pitch of the interconnect lines being fabricated. Metal pitch generally refers to the closest packing that interconnect lines can achieve. Metal pitch may be a width of a minimum size metal line or a minimum spacing between lines. Stamping surfaces 14 are triangular in cross section, terminating at sharp angle edges, but may alternatively be trapezoidal in cross section, as illustrated in FIG. 2.

Figure 2:
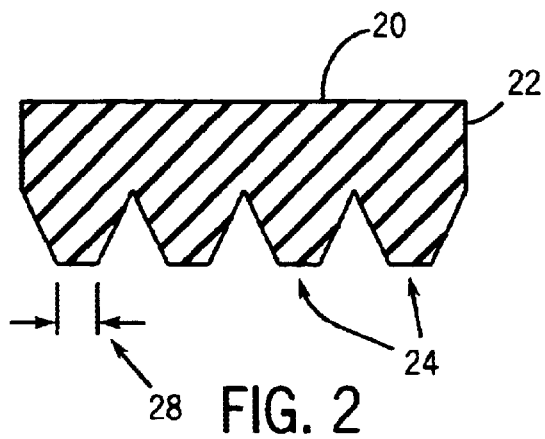
FIG. 2 is a schematic cross-sectional view of a stamp, according to another exemplary embodiment.
Figure 3:
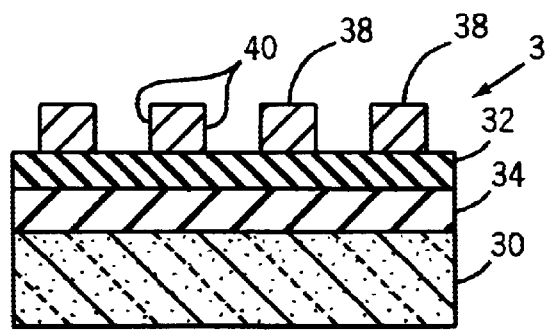
FIG. 3 is a schematic cross-sectional view of a substrate used to make a stamp, illustrating a photoresist apply step.

FIG. 2 illustrates a stamp 20 according to an alternative embodiment. Stamp 20 includes a stamp base 22 and stamping surfaces 24, wherein each of stamping surfaces 24 has a width 28. Alternative geometric shapes and structures for stamping surfaces 24 are contemplated, including various circuit patterns which may or may not include parallel lines.

Referring now to FIGS. 3–8, exemplary methods of making stamp 10 and stamp 20 will now be described. A portion 30 of a substrate, such as a semiconductor substrate including silicon, gallium arsenide, or other substrate, is illustrated. First and second layers of material 32, 34 are provided over substrate 30. Layers 32 and 34 are used to provide a very fine etch stop layer without the need for an extreme lithography step. According to one exemplary embodiment, second layer 34 is an insulative layer, such as an oxide, (e.g., $SiO_2$) having a thickness of approximately 500 angstroms (Å). The first layer of material is also an insulative layer in this exemplary embodiment, such as a nitride layer (e.g., $Si_3N_4$), having a thickness of approximately 1,000 Å. Other materials and thicknesses may be used to provide the etch stop layers.

A photoresist layer 36 is provided over first layer 32. Photoresist layer 36 is exposed to a light source, such as an excimer layer having a wavelength of 248 nm, 193 nm, 157 nm, or other wavelengths. The light source is provided to photoresist layer 36 through a mask or reticle. Photoresist layer 36 is then developed to leave portions 38 on layer 32, forming apertures 40 in photoresist layer 36. Portions 38 have a width of approximately 150 nanometers. Portions 38 are further reduced in size, if desired, using an $O_2$ plasma trimming process to achieve a smaller feature size. Accordingly, portions 38 may have a final width, after plasma trimming, of approximately 40 nanometers, or less than 60 nanometers. The plasma trimming process allows etching of even smaller features in layers 32 and 34.

Figure 4:
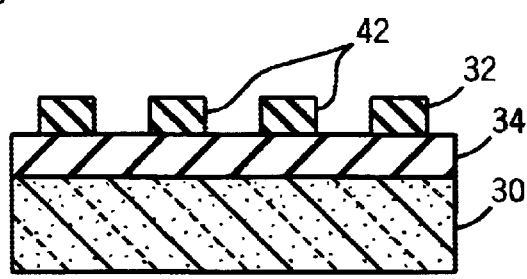
FIG. 4 is a schematic cross-sectional view of a substrate used to make a stamp, illustrating a first aperture formation step.

Referring now to FIG. 4, portions 38 of photoresist layer 36 act as an etch mask for etching apertures 42 in first layer 32. For example, a reactive ion etch (RIE) may be used to etch first layer 32 through the photoresist mask. The photoresist mask is then removed to provide the structure illustrated in FIG. 4.

Figure 5:
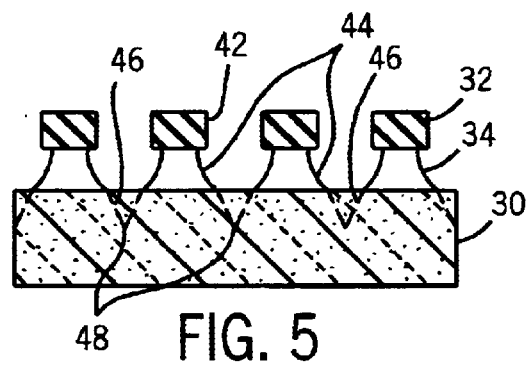
FIG. 5 is a schematic cross-sectional view of a substrate used to make a stamp, illustrating a second aperture formation step and a substrate etch step.

Referring now to FIG. 5, second apertures 44 are formed in second layer of material 34. In this exemplary embodiment, the oxide of layer 34 is removed using a buffered HF solution. Layers 32 and 34 are then used as a mask for etching substrate 30 to form grooves 46 therein. Silicon substrate 30 is etched in the <111> direction using a KOH solution. Notably, the widths of apertures 42 and 44 in layers 32 and 34, respectively, determine the final metal pitch of grooves 46. Thus, preferably the width of portions 38 (FIG. 3) are made as small as possible to avoid any flat portion at the top of grooves 46 which will increase the smallest achievable metal pitch.

Figure 6:
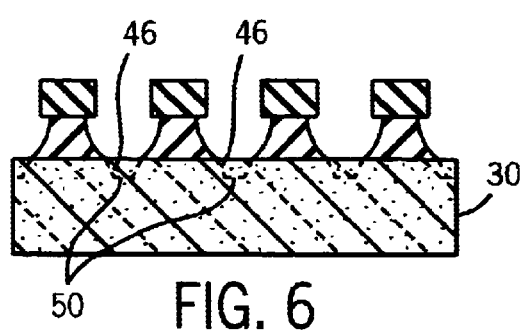
FIG. 6 is a schematic cross-sectional view of a substrate used to make a stamp, illustrating a second aperture forming step and a substrate etch step, according to another exemplary embodiment.

In the embodiment of FIG. 5, substrate 30 is etched for a sufficient period of time in the <111> direction to fabricate sharp edges 48, which come to a peak or point. This period of time depends on the temperature of etching and the amount of silicon that is to be etched. The time may be 2–5 minutes, or as short as 1–20 seconds. In the embodiment of FIG. 6, the etching of substrate 30 proceeds for a shorter, predetermined period of time to leave flat portions 50 in grooves 46. Notably, the width of flat surfaces 50 is variable and adjustable based upon the amount of time the etching step proceeds.

Figure 7:
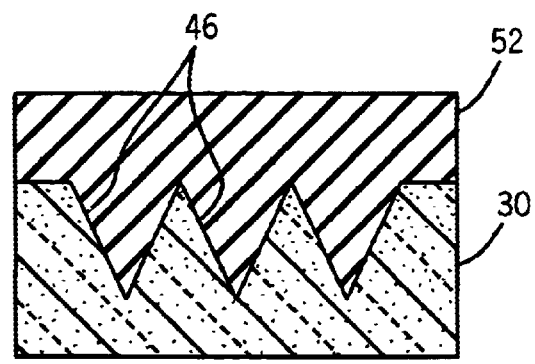
FIG. 7 is a schematic cross-sectional view of a substrate used to make a stamp, illustrating an elastomer filling step.
Figure 8:
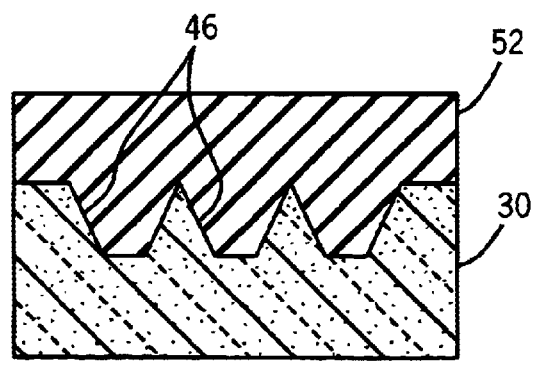
FIG. 8 is a schematic cross-sectional view of a substrate used to make a stamp, illustrating an elastomer filling step, according to another exemplary embodiment.

Referring now to FIGS. 7 and 8, an elastomer providing step is illustrated. In these exemplary embodiments, an elastomer material 52 is poured into, grown upon, or otherwise provided to grooves 46. In the case of PDMS, elastomer material 53 is poured into grooves 46 in liquid form and allowed to harden. The hardening process may involve curing, heating, or simply exposing the liquid to ordinary atmospheric conditions of temperature, pressure, etc. Substrate 30 with grooves 46 is sometimes referred to as a "master", since it provides a master pattern for forming grooves 46. Elastomer 52 is peeled off of the master after hardening, resulting in the stamps illustrated in FIG. 1 or FIG. 2.

Figure 9:
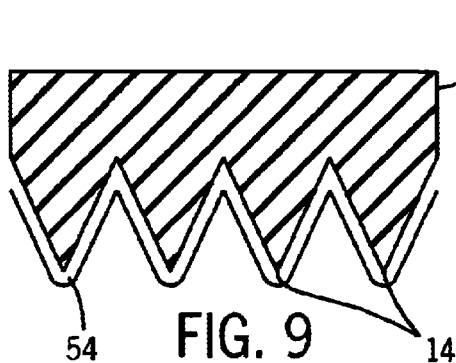
FIG. 9 is a schematic cross-sectional view of a stamp, illustrating a copper plating catalyst providing step, according to an exemplary embodiment.

Referring now to FIGS. 9–18, an exemplary method of patterning a layer of copper on a material surface will now be described. FIG. 9 illustrates stamp 10 fabricated by the process described hereinabove. Alternatively, stamp 10 may be fabricated by other processes. Stamping surfaces 14 of stamp 10 are provided or covered with a copper plating catalyst 54, wherein copper plating catalyst 54 is any solution, such as an active agent, which may act as a seed layer for growing a copper material when exposed to a copper solution. For example, an electroless copper deposition process is utilized in this exemplary embodiment, wherein copper plating catalyst 54 is a palladium colloid. Alternatively, other copper plating catalysts may be used.

Figure 10:
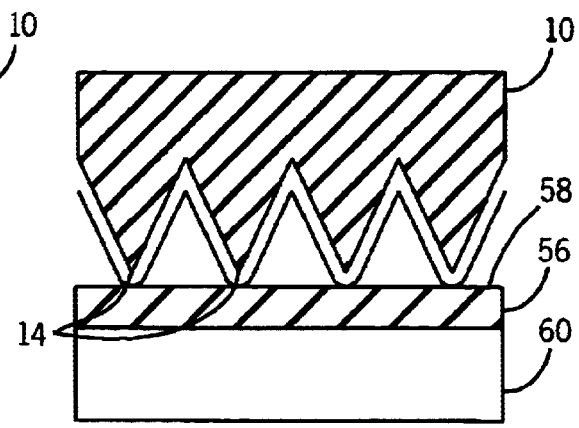
FIG. 10 is a schematic cross-sectional view of the stamp of FIG. 9, shown being used in a stamping step.

Referring now to FIG. 10, stamp 10 is applied to a material 56 having a material surface 58. For example, material 56 may be an insulative material, such as, a dielectric. Layer 56 may further include a plurality of conductive vias (not shown) between a first layer of devices or interconnects and a copper interconnect layer to be fabricated using stamp 10. Thus, material 60 may include a semiconductor substrate, transistors, interconnects, vias, or other elements of an integrated circuit. According to one alternative embodiment, stamp 10 may be circular in shape and may be rolled upon material surface 58 to deposit copper plating catalyst thereon. Other alternative stamping processes are contemplated.

Figure 11:
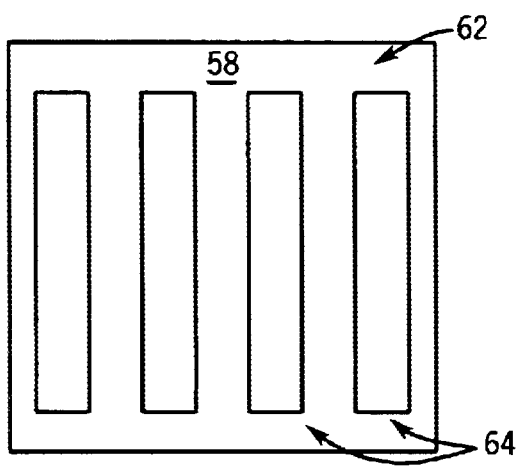
FIG. 11 is a schematic top view of a layer of material having copper plating catalyst stamped thereon, according to an exemplary embodiment.

Referring now to FIG. 11, after applying stamp 10, and more particularly, stamping surfaces 14 to material surface 58 and removing the stamp therefrom, a pattern 62 of copper plating catalyst is left on material surface 58. In the exemplary embodiment, pattern 62 is configured for a copper interconnect layer, wherein a plurality of parallel lines 64 are printed. Parallel lines 64 are located where copper will be plated in a subsequent electroless deposition of copper. The widths of lines 64 are very small (e.g., 50 nanometers, or less than 100 nanometers) due to the sharp edge associated with surfaces 14 of stamp 10. A somewhat wider line may be achieved by using stamp 20 (FIG. 2). In alternative configurations, copper plating catalyst may be applied with other patterns, which may or may not include parallel lines of conductors. For example, a plurality of circular or square-shaped via contact pads may be fabricated using this method.

Figure 12:
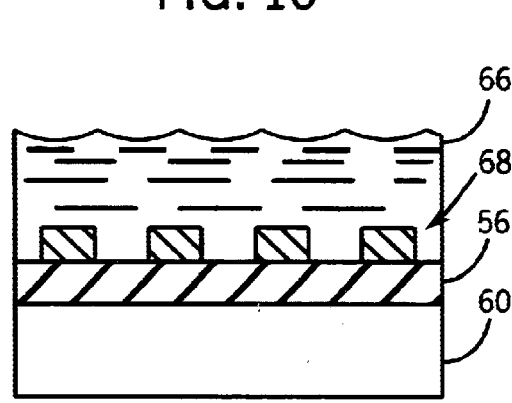
FIG. 12 is a schematic cross-sectional view of a copper solution providing step, according to an exemplary embodiment.

Referring now to FIG. 12, a copper solution 66 is provided over the copper plating catalyst. The copper solution is illustrated as a liquid solution in this exemplary embodiment, but may alternatively be a gas, a solid, a plasma, or other solutions containing copper atoms. In this exemplary embodiment, an electroless copper plating reaction is performed between the copper plating catalyst and the copper solution. Copper may be reduced with formaldehyde in an alkaline solution. The reaction is catalyzed by palladium colloid to form a layer of copper 68 at the locations of the catalyst. Copper solution 66 is provided to grow a copper layer 68 to a height of between 200 and 300 nm. The width of the parallel lines of copper layer 68 corresponds to, and may be the same as, the width of the parallel lines 64 of pattern 62. Electroless plating is done twice by providing a copper solution over the copper plating catalyst twice after each application of stamp 10, in this exemplary embodiment. Applying copper solution twice provides metal studs that can be connected to the next level of metal.

Figure 13:
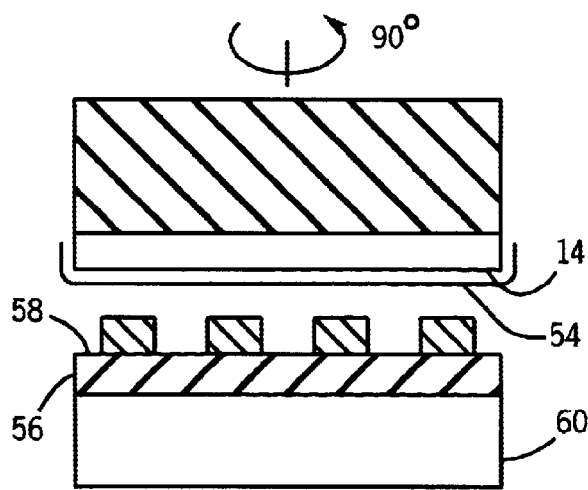
FIG. 13 is a schematic cross-sectional view of a second stamping step, according to an exemplary embodiment.
Figure 14:
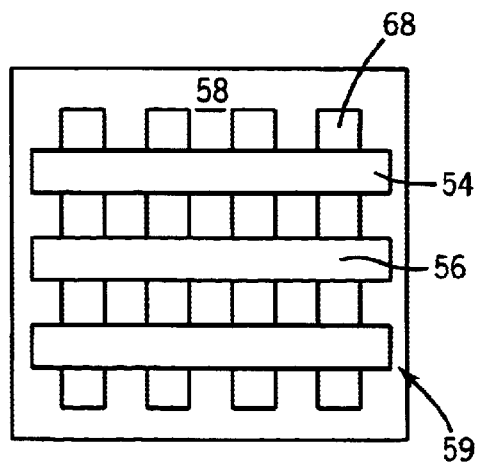
FIG. 14 is a schematic top view of the layer of material of FIG. 11 after the second stamping step of FIG. 13, according to an exemplary embodiment.

Referring now to FIG. 13, in an embodiment wherein stamp 10 is used to provide copper interconnects, stamp 10 may be rotated 90 degrees, provided with a copper plating catalyst 54 on surface 14, and again applied to material surface 58 to form a pattern 59 (FIG. 14). Due to the conformal nature of the elastomer stamp 10, copper plating catalyst in pattern 59 is provided in a plurality of second parallel lines overlaying copper layer 68 and material surface 58. This configuration is illustrated in FIG. 14, showing a top view of material surface 58 having copper layer 68 in a plurality of first parallel lines and copper plating catalyst pattern 59 in a plurality of second parallel lines perpendicular to the first parallel lines. For example, between 30,000 and 50,000 (for a complex IC) parallel lines may be fabricated in each of the horizontal and vertical directions.

Figure 15:
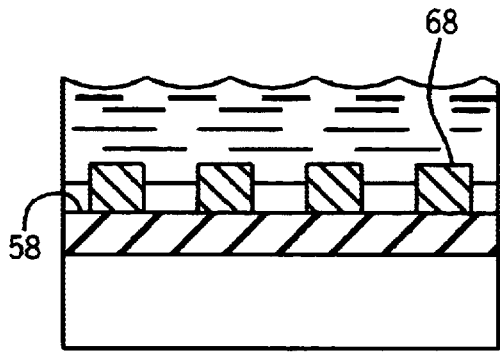
FIG. 15 is a schematic cross-sectional view of a copper solution providing step, according to exemplary embodiment.

Referring now to FIG. 15, copper solution 66 is provided over material surface 58, copper plating catalyst pattern 59, and copper layer 68. Again, copper solution 66 is provided twice, but may alternatively be applied once. During this provision of copper solution, a second copper layer 70 is grown. Due to the autocatalytic nature of the electroless deposition process, copper layer 68 will continue to grow, and will grow at a faster rate than second copper layer 70. In this exemplary embodiment, second copper layer 70 includes a second plurality of parallel copper lines perpendicular to the first plurality of copper lines comprising layer 68. According to one exemplary embodiment, copper interconnect lines are grown to a height of 600–800 nm in the case of the first copper layer 68 and 200–300 nm in the case of second copper layer 70. Copper lines may be provided with a width of 20 to 60 nanometers using the exemplary process disclosed herein.

Figure 16:
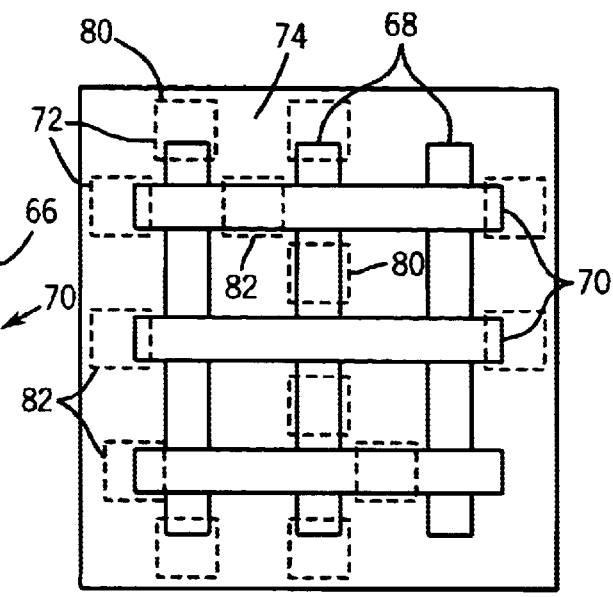
FIG. 16 is a schematic top view of the layer of material of FIG. 11 illustrating a photoresist application step, according to an exemplary embodiment.

Referring now to FIG. 16, a top view of material surface 58 (covered by a photoresist mask 74) and associated copper layers 68 and 70 is illustrated. The first and second plurality of copper interconnect lines comprising layers 68 and 70 are very thin and have self-aligned contact pillars to other metal layers. However, layers 68 and 70 also include many unneeded or redundant lines. Accordingly, portions of layers 68 and 70 are removed to make the proper interconnects. Advantageously, a non-critical or less critical masking step may be utilized to remove the lines. A mask 74 having apertures 72 therein is applied over layers 68 and 70. Layer 74 is a diffusion barrier (e.g., Ta, Ti, Tin, etc.) in this exemplary embodiment. An etchant is provided through apertures 72 to remove portions of copper interconnect layers 68 and 70.

According to one embodiment, two non-critical masking steps are used to remove portions of layers 68 and 70 due to the difference in height between the two layers. A first set of apertures 80 may be provided in a first mask and etch step to etch the thicker lines, and a second mask having apertures 82 is provided to etch the thinner lines. Alternatively, if the etching process is highly selective toward the underlying layer of material (e.g., material 56), then only one mask may suffice since layers 68 and 70 may be overetched enough to remove both the thin and the thicker copper lines.

Figure 17:
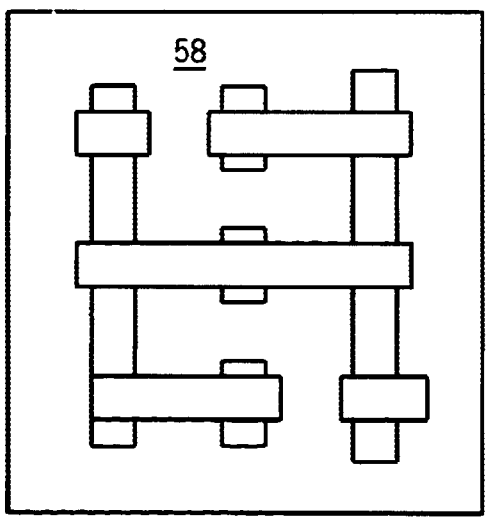
FIG. 17 is a schematic top view of a layer of material illustrating a non-critical etch step, according to an exemplary embodiment.

FIG. 17 illustrates a top view of material surface 58 after etching and subsequent removal of mask layer 74.

Advantageously, the exemplary process disclosed herein provides excellent alignment with vias in material 56. Layers of copper material 68 and 70 deposit copper above these vias and in contact with these vias in an excellent pillar configuration. Further, critical masking is not required to fabricate the interconnect lines.

Figure 18:
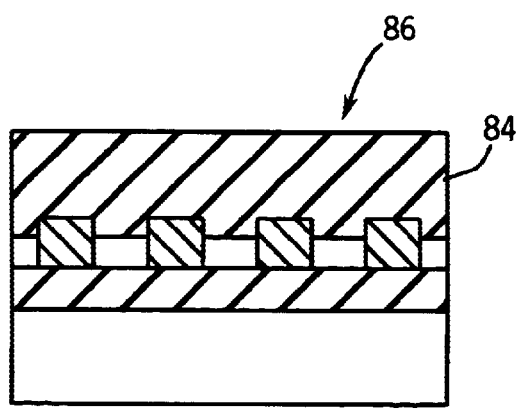
FIG. 18 is a schematic cross-sectional view of a portion of an integrated circuit illustrating an insulative layer providing step, according to an exemplary embodiment.

Referring now to FIG. 18, an interlayer dielectric or other insulative material 84 is provided over copper interconnect layers and subsequently planerized to provide a flat upper surface 86. Any suitable low-K material may be utilized, such as, a dielectric material having a dielectric constant less than 3.7. Planarization may occur by chemical mechanical planerization (CMP), or other polishing step.

While the exemplary embodiments disclosed herein are directed to fabricating periodic or parallel interconnect lines, stamps can also be made that do not have periodic lines.

For metal pitches below 200 nm, a different approach may be used. Less critical masks may be used to fabricate the stamp, wherein the stamps have pitches of, for example 600 nm, or between 400 nm and 800 nm. The stamps may be used to stamp a catalyst three times, each time aligning the stamp 200 nm away from the previous stamp. The stamp has an alignment mark and standard aligning techniques are used to align the stamp with the substrate. This process advantageously eliminates critical masking steps, and alignment errors will typically be less than 40 nm for conventional alignment techniques.

While the exemplary embodiments illustrated in the FIGS. and described above are presently preferred, it should be understood that these embodiments are offered by way of example only. For example, various patterns may be printed using the stamps and various stamping processes described herein, in addition to interconnect lines. Further, the teachings herein may find other applications in other soft lithographic techniques. Accordingly, the present invention is not limited to a particular embodiment, but extends to various modifications that nevertheless fall within the scope of the appended claims.

What is claimed is:

1. A method of patterning first conductive lines in a first layer and second conductive lines in a second layer, the first conductive lines being connected to the second conductive lines, the method comprising:
   applying a first copper plating catalyst to a material surface of a material in a first pattern by stamping;
   providing a first copper solution over the first copper plating catalyst whereby the first conductive lines are formed;
   applying a second copper plating catalyst to the material surface and the first conductive lines in a second pattern by stamping, the first pattern having a different orientation or being a different pattern than the second pattern;
   providing a second copper solution over the second copper plating catalyst, whereby the second conductive lines are formed, the first conductive lines being electrically coupled to the second conductive lines at intersections of the first conductive lines and the second conductive lines;
   providing a first non-critical photolithographic mask layer above the first and second conductive lines;
   patterning the first non-critical photolithographic mask layer to provide first apertures exposing the first and second conductive lines; and
   removing at least one of the first conductive lines or the second conductive lines at the location of the first apertures.

2. The method of claim 1, wherein only the second conductive lines are removed in the removing step.

3. The method of claim 2, further comprising:
   removing the first non-critical photolithographic mask layer;
   providing a second non-critical photolithographic mask layer;
   patterning the second photolithographic mask layer to provide second apertures exposing the first and second conductive lines; and
   a removing the first and second conductive lines at the locations of the second apertures.

4. The method of claim 1, wherein the material surface is a dielectric layers wherein the dielectric layer is part of an integrated circuit on a semiconductor substrate.

5. The method of claim 1, wherein the applying steps utilize a single stamping surface.

6. The method of claim 5, wherein the stamping surface comprises a plurality of protrusions, each protrusion being trapezoidal in cross-section.

7. The method of claim 1, wherein the removing step is an overetching step that removes both the first conductive lines and the second conductive lines.

8. The method of claim 1, wherein the material is a low-k dielectric material.

9. The method of claim 1, wherein the second conductive lines are thinner than the first conductive lines.

10. The method of claim 1, wherein the first copper plating catalyst and the second cooper plating catalyst include the same material and the first copper solution and the second copper solution include the same material.

11. A method of fabricating an integrated circuit including an interconnect layer comprised of a first pattern of first conductive lines in a first layer and a second pattern of second conductive lines in a second layer, the method comprising;
   applying a copper plating catalyst to a material surface above a dielectric layer in the first pattern by stamping;
   providing a solution including a metal over the plating catalyst whereby the first a conductive lines are formed;
   applying the copper plating catalyst to the surface and the first conductive lines in the second pattern by stamping;
   providing the solution including the metal over the plating catalyst, whereby the second conductive lines are formed;
   providing a first mask layer above the first and second conductive lines;
   patterning the first mask layer to provide apertures; and
   etching at least one of the first conductive lines or the second conductive lines at the location of the apertures.

12. The method of claim 11, wherein only the second conductive lines are removed in the etching step.

13. The method of claim 12 comprising:
   providing a second mask layer;
   patterning the second mask layer to have second apertures; and
   removing the first and second conductive lines at the locations of the second apertures.

14. The method of claim 11, wherein a material associated with the material surface is a dielectric layer.

15. The method of claim 11, wherein the applying step utilizes a single stamping surface.

16. The method of claim 11, wherein the removing step is an overetching step that removes both the first conductive lines and the second conductive lines.

17. A method of fabricating an interconnect layer, the method comprising:

first applying plating catalyst to a material surface in a first pattern by stamping;

first providing solution including a metal over the plating catalyst whereby first conductive lines are formed;

second applying plating catalyst to the material surface and the first conductive lines in a second pattern by stamping;

a second providing solution Including metal over the plating catalyst, whereby second conductive lines are formed;

providing a first mask layer above the first and second conductive lines;

patterning the first mask layer to provide apertures; and etching at least one of the first conductive lines or the second conductive lines at the location of the apertures.

18. The method of claim 17, wherein only the second conductive lines are removed in the etching step.

19. The method of claim 18, further comprising:

providing a second mask layer;

patterning the second mask layer to have second apertures; and removing the first and second conductive lines at the locations of the second apertures.

20. The method of claim 17, wherein the second conductive lines are thinner than the first conductive lines.

* * * * *

UNITED STATES PATENT AND TRADEMARK OFFICE
CERTIFICATE OF CORRECTION

PATENT NO.      : 6,623,803 B1
DATED           : September 23, 2003
INVENTOR(S)     : Zoran Krivokapic It is certified that error appears in the above-identified patent and that said Letters Patent is hereby corrected as shown below:

Column 8,
Line 9, delete the word "a" before the word "removing";
Line 12, replace the word "layers" with the word -- layer --;

Column 9,
Line 8, delete the word "a" before the word "second";
Line 8, replace the word "Including" with the word -- including --.

Signed and Sealed this

Twenty-fifth Day of November, 2003

JAMES E. ROGAN
*Director of the United States Patent and Trademark Office*